(12) United States Patent
Yin (10) Patent No.: US 10,636,719 B2
(45) Date of Patent: Apr. 28, 2020

(54) SEMICONDUCTOR PACKAGING WITH REDUCED CRACKING DEFECTS

(71) Applicants: Semiconductor Manufacturing International (Shanghai) Corporation, Shanghai (CN); Semiconductor Manufacturing International (Beijing) Corporation, Beijing (CN)

(72) Inventor: Yuan Zi Yin, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/483,836

(22) Filed: Apr. 10, 2017

(65) Prior Publication Data

US 2017/0309536 A1   Oct. 26, 2017

(30) Foreign Application Priority Data

Apr. 26, 2016   (CN) .......................... 2016 1 0263531

(51) Int. Cl.
*H01L 21/768* (2006.01)
*H01L 23/31* (2006.01)
(Continued)

(52) U.S. Cl.
CPC .... *H01L 23/3171* (2013.01); *H01L 21/76802* (2013.01); *H01L 21/76831* (2013.01);
(Continued)

(58) Field of Classification Search
CPC ............. H01L 23/3171; H01L 23/3142; H01L 23/562; H01L 23/291; H01L 23/3192;
(Continued)

(56) References Cited

U.S. PATENT DOCUMENTS 6,174,822 B1 * 1/2001 Nagano ............. H01L 21/76895
257/E21.009
6,297,554 B1 * 10/2001 Lin .................... H01L 21/76808
257/752
(Continued)

FOREIGN PATENT DOCUMENTS

CN          1830079        9/2006
CN        101425483        5/2009
(Continued)

OTHER PUBLICATIONS

European Application No. 17167238.9, Extended European Search Report dated Sep. 22, 2017, 8 pages.
(Continued)

*Primary Examiner* — Allen L Parker
*Assistant Examiner* — Gustavo G Ramallo
(74) *Attorney, Agent, or Firm* — Kilpatrick Townsend & Stockton LLP (57) ABSTRACT

A method of forming a package includes providing a die, which includes a substrate having a circuit, a first passivation layer on the substrate, a plurality of pads on the first passivation layer, and a second passivation layer disposed on the first passivation layer and covering the plurality of pads. The method also includes forming one or more trenches by etching the second passivation layer that overlies a portion of the first passivation layer on the outside of the plurality of pads, and forming an organic polymer overlying the die after the one or more trenches are formed, thereby forming the package.

19 Claims, 5 Drawing Sheets

(51) Int. Cl.
*H01L 23/00* (2006.01)
*H01L 23/29* (2006.01)
(52) U.S. Cl.
CPC .......... *H01L 23/291* (2013.01); *H01L 23/293* (2013.01); *H01L 23/3142* (2013.01); *H01L 23/3178* (2013.01); *H01L 23/3192* (2013.01); *H01L 23/562* (2013.01); *H01L 24/03* (2013.01); *H01L 24/06* (2013.01); *H01L 2224/0612* (2013.01)
(58) Field of Classification Search
CPC ............... H01L 23/3178; H01L 23/293; H01L 21/76831; H01L 21/76802; H01L 24/06; H01L 24/03; H01L 21/768
See application file for complete search history.

(56) References Cited

U.S. PATENT DOCUMENTS

| | | | |
|---|---|---|---|
| 9,269,678 | B2 | 2/2016 | Wang |
| 2005/0167804 | A1 | 8/2005 | Pan et al. |
| 2005/0167824 | A1 | 8/2005 | Zhang et al. |
| 2008/0182398 | A1* | 7/2008 | Carpenter ............... H01L 23/13 438/612 |
| 2008/0277765 | A1* | 11/2008 | Lane .................... H01L 21/563 257/622 |
| 2009/0115024 | A1* | 5/2009 | Jeng ..................... H01L 23/562 257/620 |
| 2010/0006984 | A1 | 1/2010 | Watanabe et al. |
| 2011/0006389 | A1 | 1/2011 | Bachman et al. |
| 2013/0292793 | A1* | 11/2013 | Poucher ............... H01L 29/0649 257/522 |
| 2013/0337615 | A1* | 12/2013 | Xu .................... H01L 21/02112 438/125 |
| 2014/0116760 | A1 | 5/2014 | Wang |
| 2015/0069623 | A1* | 3/2015 | Tsai ..................... H01L 21/563 257/774 |
| 2017/0338189 | A1* | 11/2017 | Soda .................... H01L 25/18 |
| 2017/0338273 | A1* | 11/2017 | Fujiwara ............ H01L 21/3205 |

FOREIGN PATENT DOCUMENTS

| | | |
|---|---|---|
| CN | 101681890 | 3/2010 |
| CN | 104091793 | 10/2014 |
| EP | 2273549 | 1/2011 |

OTHER PUBLICATIONS

Chinese Application No. 201610263531.9, Office Action dated Dec. 26, 2018, 8 pages.

Chinese Application No. 201610263531.9, Office Action dated Jul. 31, 2019, 10 pages.

* cited by examiner

FIG. 7

SEMICONDUCTOR PACKAGING WITH REDUCED CRACKING DEFECTS

CROSS-REFERENCES TO RELATED APPLICATIONS

This application claims priority to Chinese patent application No. 201610263531.9, filed on Apr. 26, 2016, the content of which is incorporated herein by reference in its entirety.

BACKGROUND OF THE INVENTION

The present invention relates to the field of semiconductor technology. Embodiments of the invention relate to integrated circuit package structures and manufacturing methods.

Wafer level ball grid array package (WLBGA) is an advanced packaging technology. Due to its ability to save volume and allow maximum engagement requirement, WLBGA has been widely used. However, the inventors have found that, in devices having small geometries, existing WLBGA technologies suffer from a number of drawbacks. These drawbacks can include cracking in a passivation layer overlying the pads due to stress caused by an organic polymer covering the device. As a result, the bonding pads can be exposed or eroded, leading to chip failures. This is a typical problem in the conventional chip package integration process.

Further, in more advanced packaging technologies, the device size is further reduced and the thermal budget is higher. Therefore, the film stress becomes relatively larger, and the problems described above can become more severe.

Therefore, there is an urgent need for a packaging technology that is capable of alleviating the problem of the passivation layer cracking.

BRIEF SUMMARY OF THE INVENTION

According to some embodiments of the invention, a method of forming a package includes providing a die. The die can include a substrate having a circuit, a first passivation layer on the substrate, a plurality of pads on the first passivation layer, and a second passivation layer disposed on the first passivation layer and covering the plurality of pads. The method also includes forming one or more trenches by etching the second passivation layer that overlies a portion of the first passivation layer on the outside of the plurality of pads, and forming an organic polymer overlying the die after the one or more trenches are formed, thereby forming the package.

Embodiments of the invention can reduce or suppress the cracking of the passivation layer overlying the bonding pads caused by stress in the package. The trenches at the edges of the bonding pads area can increase the contact area between the organic polymer and the passivation layer over the bonding pads. The adhesion of the organic polymer and stress distribution can be improved, reducing the stress between the polymer and the passivation layer. As a result, the reliability and yield of the package can be improved.

In an embodiment of the above method, the plurality of pads includes a first pad, which is adjacent to an edge of the substrate. The first pad is closer to said edge of the substrate than other pads. The one or more trenches are formed in the second passivation layer overlying a portion of the first passivation layer outside the first pad.

In another embodiment, the one or more trenches are located at a preset distance from a protruding portion of the second passivation layer overlying the first pad.

In another embodiment, the method also includes curing the organic polymer.

In another embodiment, the one or more trenches extend into the first passivation layer.

In another embodiment, the first passivation layer includes a first dielectric layer, a second dielectric layer, and the third dielectric layer, and the method also includes etching the first passivation layer using the second dielectric layer as an etch stop layer.

In another embodiment, each of the one or more trenches is an annular trench surrounding the circuit.

In another embodiment, the package includes at least two annular trenches.

In another embodiment, the die further includes a sealing structure around the circuit in the vicinity of the die edge, and the one or more trenches are located between the pad and the sealing structure.

In another embodiment, the first passivation layer includes a nitride layer and an oxide layer, and the second passivation layer includes a nitride layer and an oxide layer.

According to some embodiments of the present invention, a package, e. g. an integrated circuit package, includes a die. The die can have a substrate having a circuit, a first passivation layer on the substrate, a plurality of pads on the first passivation layer, and a second passivation layer disposed on the first passivation layer and covering the plurality of pads. The package also includes one or more trenches in the second passivation layer that overlies a portion of the first passivation layer on the outside of the plurality of pads, and an organic polymer overlying the die and filling the one or more trenches is formed, thereby forming the package.

In an embodiment of the above package, the plurality of pads includes a first pad adjacent to an edge of the substrate. The first pad is closer to the edge of the substrate than other pads. The one or more trenches are formed in the second passivation layer overlying a portion of the first passivation layer outside the first pad.

In another embodiment, the one or more trenches are located at a preset distance from a protruding portion of the second passivation layer overlying the first pad.

In another embodiment, the first passivation layer includes a first dielectric layer, a second dielectric layer, and the third dielectric layer, and the one or more trenches extend through the first dielectric layer and stop at the second insulating dielectric layer.

In another embodiment, the one or more trenches extend into the first passivation layer.

In another embodiment, each of the one or more trenches is an annular trench surrounding the circuit.

In another embodiment, the package includes at least two annular trenches.

In another embodiment, the die further includes a sealing structure around the circuit in the vicinity of the die edge, and the one or more trenches are located between the pad and the sealing structure.

In another embodiment, the first passivation layer comprises a nitride layer and an oxide layer, and the second passivation layer comprises a nitride layer and an oxide layer.

The following description, together with the accompanying drawings, will provide further understanding of the nature and advantages of the claimed invention.

DETAILED DESCRIPTION OF THE INVENTION

The drawings of various exemplary embodiments of the present invention will be described in detail. It should be noted that, unless otherwise specified, the relative arrangement set forth in these embodiments, components and steps, the numerical expressions, and values do not limit the scope of the present invention. At the same time, it should be appreciated that, for ease of description, the dimensions of the various parts are not illustrated in the drawings according to the actual proportional relationship.

The following description of exemplary embodiments is merely illustrative of the present invention and in no way intends to impose any restrictions on its use or application. Techniques, methods, and equipment known to someone of ordinary skill in the relevant art may not be discussed in detail, but in appropriate cases, the techniques, methods and equipment should be considered as part of the specification.

In all the examples shown and discussed, any specific value is to be construed as merely illustrative, and not as a limitation. Accordingly, another exemplary embodiment may have different values. It should be also noted that like reference numerals and letters refer to similar items in the following figures, and thus, once an item is defined in one figure, it need not be further discussed in subsequent figures.

In the package of semiconductor dies, the ball grid array is covered with a passivation layer, which in turn is covered by organic polymers (for example, epoxy or polyimide). The inventors have discovered that, during thermal treatment, the organic polymer layer is contracted, dragging up the passivation layer. On the other hand, the bonding pads under the passivation layer are expanded due to heat treatment, pressing against the passivation layer. Further, the inventors have identified that the stress on the passivation layer tends to concentrate near the step region or protruding region of the passivation layer at the edge of the pads. The thermal mismatch between the pads and the passivation layer can, in the passivation layer near the step region, cause fatigue, leading to cracking. Moreover, subsequent stability tests, for example, the unbiased highly accelerated stress test (uHAST), can further increase the cracking of the passivation layer. The cracks in the passivation layer can ultimately cause the bonding pads to be exposed. Embodiments of the present invention provide methods and devices that address the problems described above.

Figure 1:
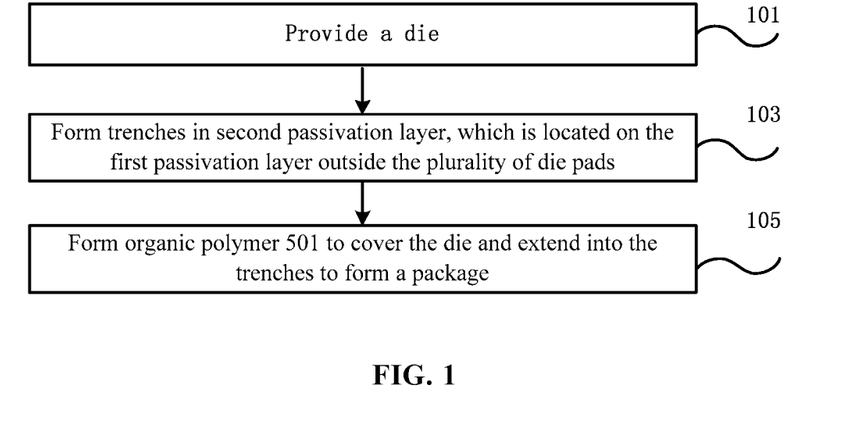
FIG. 1 is a simplified flowchart illustrating a method for manufacturing a package according to an embodiment of the present invention.

FIG. 1 is a simplified flowchart illustrating a method for manufacturing a package according to an embodiment of the present invention. The steps in this flowchart are further described below with reference to FIGS. 2-7.

Figure 2:
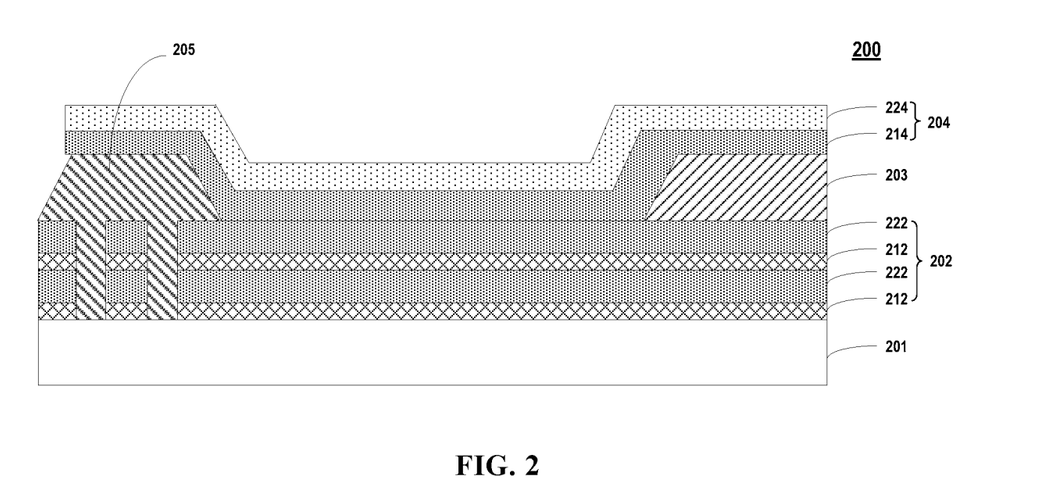
FIG. 2 is a simplified cross-sectional diagram illustrating a view of a die according to an embodiment of the present invention.

As shown in FIG. 1, in step 101, the method includes providing a die. FIG. 2 is a simplified cross-sectional diagram illustrating a view of a die according to an embodiment of the present invention. As shown in FIG. 2, a die 200 includes a substrate 201, which may be a silicon substrate having a circuit or other semiconductor material substrates. Here, for clarity, the circuit is not shown in FIG. 2. Die 200 further includes a first passivation layer 202 on the substrate 201. In one embodiment, the first passivation layer 202 may include a stack of nitride layer 212 and oxide layer 222. For example, the first passivation layer 202 may include a plurality of nitride layer 212 (e.g., SiN) and oxide layer 222 (e.g., formed from TEOS, tetraethoxysilane). In another embodiment, the first passivation layer 202 may be formed by an oxide layer 222, a nitride layer 212, and an oxide layer 222 forming a three-layer stack. As a non-limiting example, the thickness of the nitride layer 212 may be about 750 Angstroms (Å), and the thickness of the oxide layer 222 may be about 4000 Å.

Die 200 can also include a plurality of bonding pads 203 on the first passivation layer 202. It is noted that FIG. 2 merely schematically shows a pad 203 as an example. Those skilled in the art will readily understand that a plurality of pads 203 may be distributed on the first passivation layer 202. In an embodiment, pad 203 may be an aluminum (Al) pad, and the thickness of pad 203 can be, for example, about 14.5 nm.

Die 200 can further include a second passivation layer 204 overlying the first passivation layer 202 and covering the plurality of pads 203. The second passivation layer 204 may include a stack of an oxide layer 214 and nitride layer 224. Oxide layer 214 may be an oxide formed from TEOS, and a nitride layer 224 is typically silicon nitride, SiN, for example. As a non-limiting example, the thickness of the oxide layer 214 may be about 4000 angstroms, and the thickness of the nitride layer 224 may be about 6000 angstroms. In an embodiment, the die 200 may also include a sealing structure 205 surrounding the circuit in the vicinity of the die edge, e.g., a seal ring.

Figure 3A:
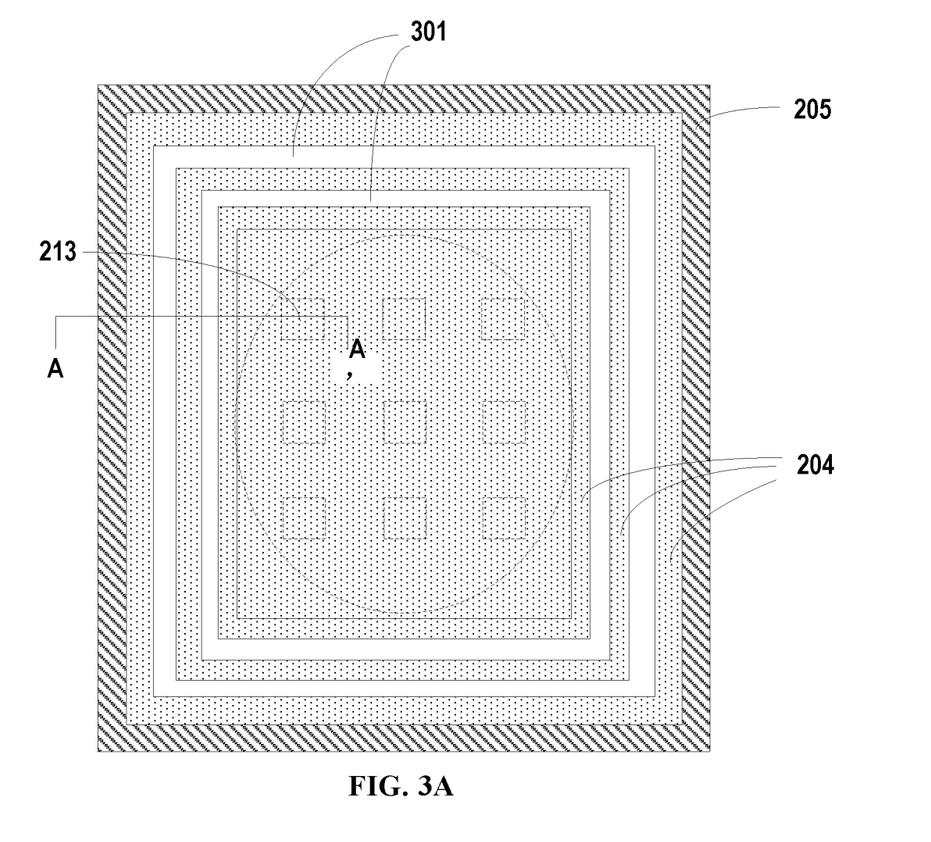
FIG. 3A is a top view of a die including the trenches.
Figure 3B:
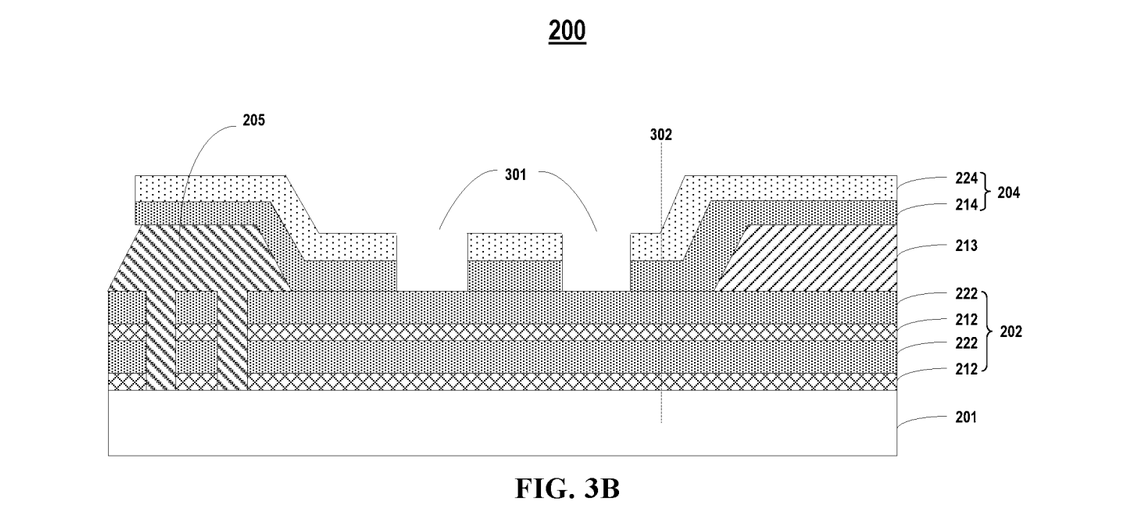
FIG. 3B is a cross-sectional view along the line A-A' in FIG. 3A according to an embodiment of the present invention.

Returning to FIG. 1, in step 103, the second passivation layer is etched to form trenches, which are located on the first passivation layer outside the plurality of die pads. FIG. 3A is a top view of die including the trenches, and FIG. 3B is a cross-sectional view along the line A-A' in FIG. 3A according to an embodiment of the present invention. As shown in FIG. 3A, a plurality of pads may include a first pad 213, which is adjacent to a first edge of the substrate. Trenches 301 are formed in the second passivation layer 204 between the first pad 213 and the edge of the substrate. As shown, the trenches are formed outside the outermost pads of the die, i.e., between the outermost die pads and the edge of the die.

In an embodiment, the groove or trenches 301 may be annular grooves or trenches around the circuit, shown in FIG. 3A. In some embodiments, there may be a single annular groove or trench. In other embodiments, there may be at least two annular grooves or trenches 301, so that the interfacial area can be further increased between a subsequently formed organic polymer and the die surface. Further, in the case where the die includes a sealing structure 205, grooves or trenches 301 are formed between the outermost pads 203 and the sealing structure 205.

As shown in FIG. 3B, grooves or trenches 301 are formed on the first passivation layer 202 outside of all pads 213. In other words, the etching of the second passivation layer is stopped on the first passivation layer. It is noted that the terms groove and trench are used interchangeably in this description. In FIG. 3B, dotted line 302 separates the second passivation layer into two regions. The first region, to the right of dotted line 302, the second passivation layer is disposed over the pads and is higher than the second region to the left of dotted line 302 which does not overlie the pads. In an embodiment, the trenches 301 are disposed at a certain distance away from dotted line 302.

Figure 4:
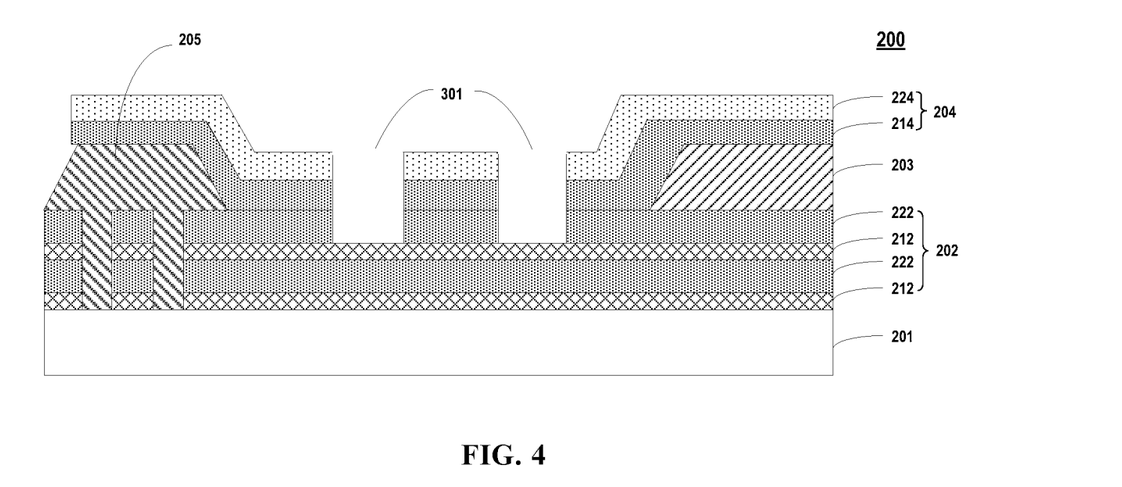
FIG. 4 is a cross-sectional view illustrating a trench formation according to another embodiment of the present invention.

FIG. 4 is a cross-sectional view illustrating a trench formation according to another embodiment of the present invention. As shown in FIG. 4, groove or grooves 301 may be extended into the first passivation layer 202. In one implementation, the first passivation layer 202 may be a laminated layer including a first dielectric layer (e.g., an oxide layer 222), a second dielectric layer (e.g., nitride layer 212) and a third dielectric layer (e.g., the oxide layer 222). Different dielectric layers in the first passivation layer can be used as an etch stop layer during the etching of the second passivation layer. The depth of etching can be selected such that grooves or trenches 301 can extend into the first passivation layer 202 at various depths, to further increase the interfacial area of the subsequently formed organic polymer in the die surface.

Figure 5:
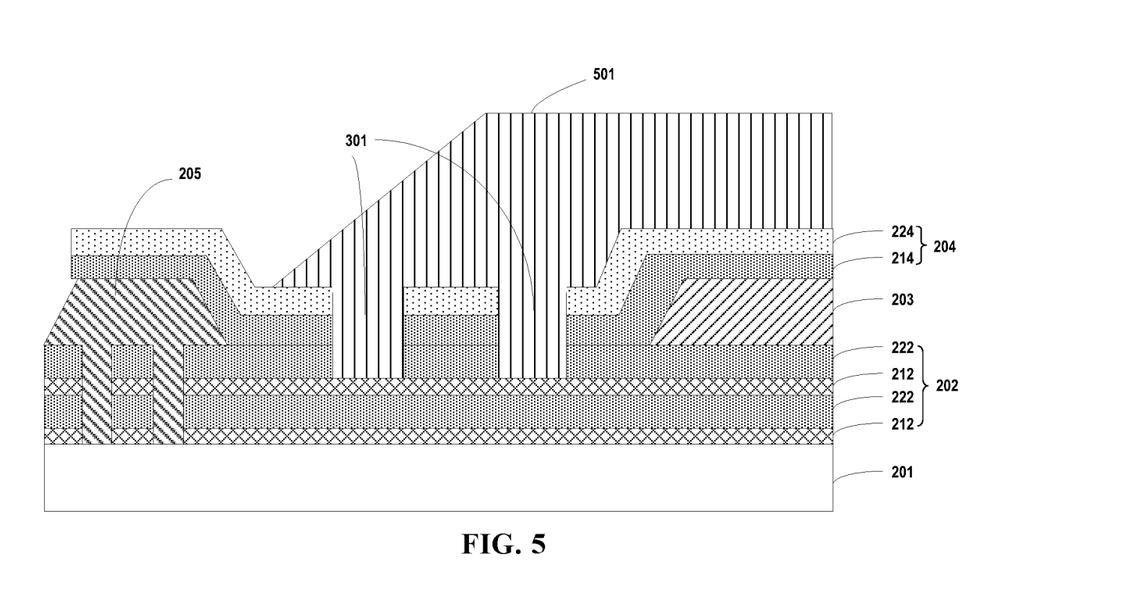
FIG. 5 is a cross-sectional view illustrating polymer filling the trenches according to an embodiment of the present invention.

Referring to FIG. 1 again, in step 105, an organic polymer 501 is formed to cover the die and extend into the trenches to thereby form the package, as shown in FIG. 5. Organic polymer 501 may be, for example, a polyimide or an epoxy resin. In some embodiments, organic polymer 501 fills trenches 301. Thereafter, organic polymer 501 may undergo a curing treatment (e.g., thermal dehydration treatment).

Figure 6A:
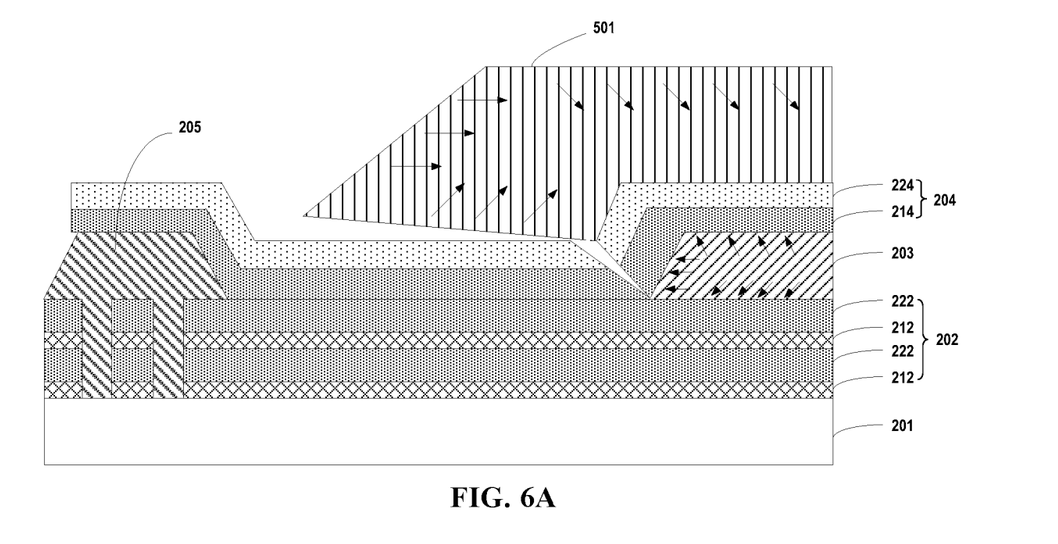
FIGS. 6A and 6B are cross-sectional view diagrams illustrating a curing process of the organic polymer according to a conventional process.
Figure 6B:
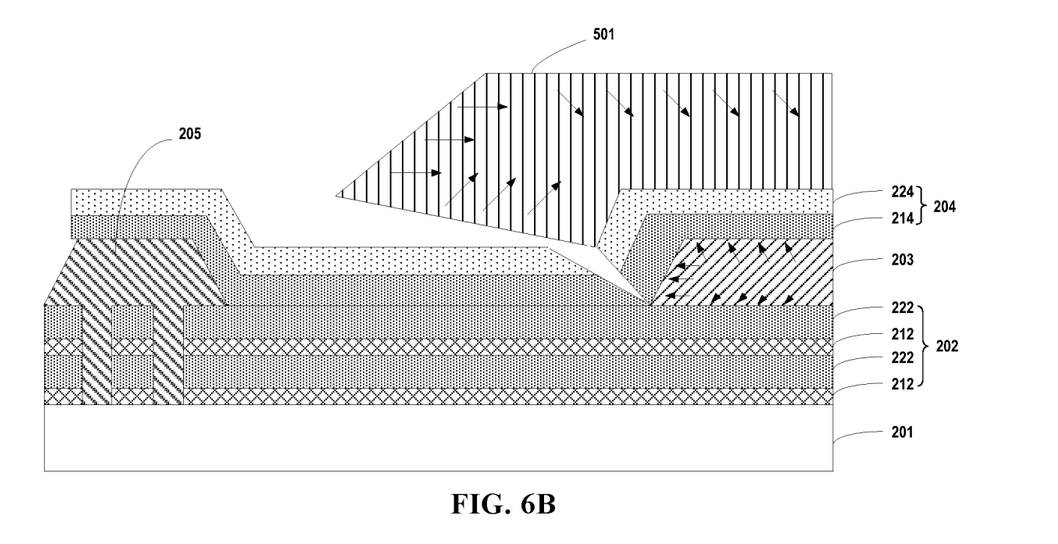

FIGS. 6A and 6B are cross-sectional view diagrams illustrating a curing process of the organic polymer according to a conventional process. In FIG. 6A, the organic polymer 501 is shown to contract during a curing treatment. The shrinkage of organic polymer 501 causes stress on the second passivation layer 204, leading to deformation or problems of peel-off. Further, pads 203 under the second passivation layer 204 may expand due to thermal expansion, so as to press against the second passivation layer 204. This can lead to cracking in second passivation layer 204 in the vicinity of the stepped region near the pads 203. FIG. 6B is a cross-section view diagram illustrating a conventional die package undergoing an unbiased highly accelerated stress test (uHAST). Under the high temperature and high humidity test condition, the cracks can further increase, which can ultimately cause pads 203 to be exposed, and become susceptible to corrosion, resulting in chip failures.

Figure 7:
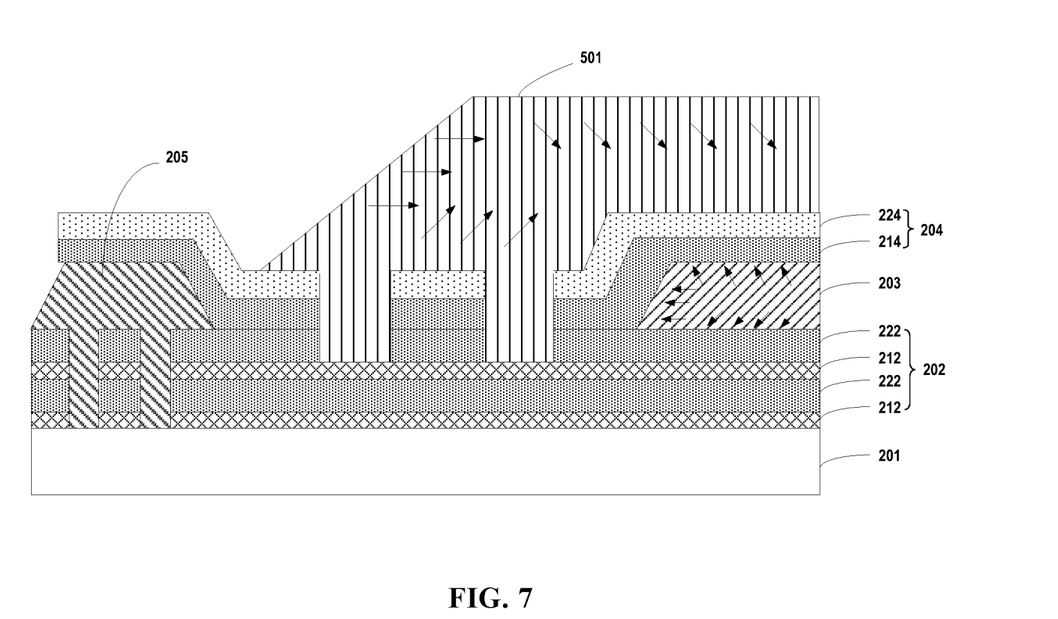
FIG. 7 is a cross-section view diagram illustrating a curing process of a die package according to an embodiment of the present invention.

FIG. 7 is a cross-section view diagram illustrating a curing process of a die package according to an embodiment of the present invention. As shown in FIG. 7, part of organic polymer 501 is extended into trenches 301. As a result, the contact area between the organic polymer and the die is increased, leading to enhanced adhesion and better stress distribution. Under this condition, the stress on the second passivation layer caused by the shrinkage or contraction of the organic polymer can be reduced or avoided. It is less likely that pads 203 are exposed to cause corrosion and failure. The reliability and yield of the package can be improved.

According to some embodiments, the present invention also provides a package as illustrated in FIG. 5. As shown in FIG. 5, the package includes a die, which includes a substrate 201 having a circuit, a first passivation layer 202 on the substrate, a plurality of pads 203 on the first passivation layer, and a second passivation layer 204 disposed on the first passivation layer and covering the plurality of pads. The package also includes one or more trenches 301 in a portion of the second passivation layer that overlies a portion of the first passivation layer on the outside of the plurality of pads. The package also includes an organic polymer overlying the die and filling the trenches. A portion of the second passivation layer overlying the pads protrudes above the other portion of the second passivation layer not covering pads. In some embodiments, the first passivation layer 202 may include a stack of one or more nitride layers 212 and one or more oxide layers 222, and the second passivation layer 204 may include one or more nitride layers 224 and one or more oxide layers 214.

In some embodiments, trenches 301 can extend into the first passivation layer 202. In some embodiments, the first passivation layer 202 may include a first dielectric layer, a second dielectric layer stack, and a third dielectric layer. In this case, trenches 301 can stop at the first, second, or third dielectric layer. In a particular embodiment, the second passivation layer stops at the second dielectric layer.

In one embodiment, as shown in FIG. 3A, the plurality of pads may include a pad 203 adjacent to a first edge of the substrate or die. In other words, pad 203 is the outermost pad of the plurality of pads. Trench 301 is formed in the second passivation layer closest to the outer edge of the substrate. As described above, the edge region of the pad array is susceptible to stress buildup, because of the rising step of the second passivation layer over the pads. In addition, one or more trenches 301 may be annular grooves. In some embodiments, there are two or more annular trenches or grooves. In one embodiment, the package may also include sealing structures, e. g., a seal ring 205 in the vicinity of the die edge around the circuit, and trenches 301 can be located between the pads 203 and the seal structure 205.

Thus, a device package structure and a manufacturing method have been described in detail. While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications. Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A package, comprising:
   a die, the die comprising:
      a substrate having a circuit;
      a first passivation layer on the substrate;
      a plurality of pads on the first passivation layer; and
      a second passivation layer disposed on the first passivation layer and covering the plurality of pads;
   a sealing structure around the circuit in a vicinity of an edge of the substrate;

one or more trenches in the second passivation layer that overlies a portion of the first passivation layer on the outside of the plurality of pads; and an organic polymer overlying the die and filling the one or more trenches, thereby forming the package, wherein the one or more trenches comprise two annular trenches, and the one or more trenches are located between the plurality of pads and the sealing structure.

2. The package according to claim 1, wherein the plurality of pads comprises a first pad, the first pad being adjacent to an edge of the substrate, the first pad being closer to said edge of the substrate than other pads;

wherein the one or more trenches are formed in the second passivation layer overlying the portion of the first passivation layer disposed between the edge of the substrate and the first pad.

3. The package according to claim 2, wherein the one or more trenches are located at a preset distance from a protruding portion of the second passivation layer overlying the first pad.

4. The package of claim 1, wherein the first passivation layer comprises a first dielectric layer, a second dielectric layer, and a third dielectric layer, and the one or more trenches extend through the first dielectric layer and stop at the second dielectric layer.

5. The package of claim 4, wherein the first dielectric layer comprises oxide, the second dielectric layer comprises nitride; and the third dielectric layer comprises oxide.

6. The package of claim 1, wherein the one or more trenches extend into the first passivation layer.

7. The package of claim 1, wherein the first passivation layer comprises a first nitride layer and a first oxide layer, and the second passivation layer comprises a second nitride layer and a second oxide layer.

8. A package, comprising:
a die, the die comprising:
a substrate having a circuit;
a first passivation layer on the substrate;
a plurality of pads comprising first pads in a center of the die and second pads between the first pads and an edge of the die, the first pads and the second pads being on a same surface of the first passivation layer;
a second passivation layer disposed on the first passivation layer and comprising a first portion on the first and second pads and a second portion between the second pads and the edge of the die, the first portion being higher than the second portion;
one or more trenches in the second portion of the second passivation layer; and an organic polymer overlying the die and filling the one or more trenches, thereby forming the package.

9. The package of claim 8, wherein the second pads completely surround the first pads.

10. The package of claim 8, wherein the first pads and the second pads are connected to the circuit.

11. The package of claim 8, wherein the package is a wafer level ball grid array package.

12. The package of claim 8, wherein each of the one or more trenches is an annular trench surrounding the circuit.

13. The package of claim 8, wherein the die further comprises a sealing structure around the circuit in a vicinity of the edge of the die, and the one or more trenches are located between the second pads and the sealing structure.

14. The package of claim 8, wherein the first passivation layer comprises a first dielectric layer, a second dielectric layer, and a third dielectric layer, and the one or more trenches extend through the first dielectric layer and stop at the second dielectric layer.

15. The package of claim 14, wherein the first dielectric layer comprises oxide, the second dielectric layer comprises nitride; and the third dielectric layer comprises oxide.

16. A package, comprising:
a die, the die comprising:
a substrate having a circuit;
a first passivation layer on the substrate;
a plurality of pads comprising first pads in a center of the die and second pads between the first pads and an edge of the die, the first pads and the second pads being on a same surface of the first passivation layer;
a second passivation layer disposed on the first passivation layer and comprising a first portion on the first and second pads and a second portion between the second pads and the edge of the die;
one or more trenches in the second portion of the second passivation layer, wherein the one or more trenches comprise two annular trenches surrounding the circuit; and
an organic polymer overlying the die and filling the one or more trenches, thereby forming the package.

17. The package of claim 16, wherein the second pads completely surround the first pads.

18. The package of claim 16, wherein the first pads and the second pads are connected to the circuit.

19. The package of claim 16, wherein the package is a wafer level ball grid array package.

* * * * *